US008859880B2

(12) United States Patent
 Wieting

(10) Patent No.: US 8,859,880 B2
(45) Date of Patent: Oct. 14, 2014

(54) METHOD AND STRUCTURE FOR TILING INDUSTRIAL THIN-FILM SOLAR DEVICES

(75) Inventor: Robert D. Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 357 days.

(21) Appl. No.: 13/006,743

(22) Filed: Jan. 14, 2011

(65) Prior Publication Data
 US 2011/0203634 A1  Aug. 25, 2011

Related U.S. Application Data

(60) Provisional application No. 61/297,661, filed on Jan. 22, 2010.

(51) Int. Cl.
 *H01L 31/042* (2014.01)
 *H01L 31/0749* (2012.01)
 *H01L 31/048* (2014.01)
 *H01L 31/02* (2006.01)
 *H01L 31/05* (2014.01)

(52) U.S. Cl.
 CPC ...... *H01L 31/02013* (2013.01); *H01L 31/0749* (2013.01); *H01L 31/048* (2013.01); *Y02E 31/048* (2013.01); *H01L 31/0504* (2013.01); *H01L 31/0201* (2013.01)
 USPC .......................................... 136/244; 136/251

(58) Field of Classification Search
 USPC ................................................ 136/244, 251
 See application file for complete search history.

(56) References Cited

U.S. PATENT DOCUMENTS

| 3,520,732 A | 7/1970 | Nakayama et al. |
| 3,828,722 A | 8/1974 | Reuter et al. |
| 3,975,211 A | 8/1976 | Shirland |
| 4,062,038 A | 12/1977 | Cuomo et al. |
| 4,204,933 A | 5/1980 | Barlow et al. |

(Continued)

FOREIGN PATENT DOCUMENTS

| AU | 1998/78651 | 2/1999 |
| AU | 2001/40599 A1 | 8/2001 |

(Continued)

OTHER PUBLICATIONS

Baumann, A., et al., Photovoltaic Technology Review, presentation Dec. 6, 2004, 18 pages.

(Continued)

*Primary Examiner* — Golam Mowla
(74) *Attorney, Agent, or Firm* — Kilpatrick Townsend & Stockton LLP

(57) ABSTRACT

A method for integrating photovoltaic module includes providing a cover plate having a first surface and a second surface opposed to the first surface and supplying photovoltaic devices respectively formed on substrates. The photovoltaic devices include photovoltaic cells electrically coupled to each other, and each cell is characterized by a thin-film photovoltaic layer sandwiched between a first electrode material and a second electrode material. The first electrode material overlies the substrate and the second electrode material overlies the thin-film photovoltaic layer. The method further includes disposing the solar devices side by side to laminate with the cover plate by means of a first organic material filled between the second electrode material and the second surface. Each of the solar devices has a peripheral edge region being sealed by a second organic material. The method further includes electrically coupling the solar devices to each other.

9 Claims, 5 Drawing Sheets

(56) References Cited

U.S. PATENT DOCUMENTS

| | | |
|---|---|---|
| 4,213,781 A | 7/1980 | Noreika et al. |
| 4,239,553 A | 12/1980 | Barnett et al. |
| 4,263,336 A | 4/1981 | Thompson et al. |
| 4,287,382 A * | 9/1981 | French .......................... 136/244 |
| 4,332,974 A | 6/1982 | Fraas |
| 4,335,266 A | 6/1982 | Mickelsen et al. |
| 4,347,436 A | 8/1982 | Fukuda et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,502,225 A | 3/1985 | Lin |
| 4,507,181 A | 3/1985 | Nath et al. |
| 4,517,403 A | 5/1985 | Morel et al. |
| 4,518,855 A | 5/1985 | Malak |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,612,411 A | 9/1986 | Wieting et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,381 A | 8/1994 | Dalzell, Jr. et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,421,909 A | 6/1995 | Ishikawa et al. |
| 5,436,204 A | 7/1995 | Albin et al. |
| 5,445,847 A | 8/1995 | Wada |
| 5,474,939 A | 12/1995 | Pollock et al. |
| 5,482,571 A | 1/1996 | Yamada et al. |
| 5,501,744 A | 3/1996 | Albright et al. |
| 5,512,107 A | 4/1996 | van den Berg |
| 5,528,397 A | 6/1996 | Zavracky et al. |
| 5,536,333 A | 7/1996 | Foote et al. |
| 5,578,103 A | 11/1996 | Araujo et al. |
| 5,578,503 A | 11/1996 | Karg et al. |
| 5,589,006 A | 12/1996 | Itoyama et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,698,496 A | 12/1997 | Fastnacht et al. |
| 5,726,065 A | 3/1998 | Szlufcik et al. |
| 5,738,731 A | 4/1998 | Shindo et al. |
| 5,855,974 A | 1/1999 | Wu et al. |
| 5,858,819 A | 1/1999 | Miyasaka |
| 5,868,869 A | 2/1999 | Albright et al. |
| 5,925,228 A | 7/1999 | Panitz et al. |
| 5,948,176 A | 9/1999 | Ramanathan et al. |
| 5,977,476 A | 11/1999 | Guha et al. |
| 5,981,868 A | 11/1999 | Kushiya et al. |
| 5,985,691 A | 11/1999 | Basol et al. |
| 6,001,744 A | 12/1999 | Doi |
| 6,040,521 A | 3/2000 | Kushiya et al. |
| 6,048,442 A | 4/2000 | Kushiya et al. |
| 6,077,722 A | 6/2000 | Jansen et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,134,049 A | 10/2000 | Spiller et al. |
| 6,160,215 A | 12/2000 | Curtin |
| 6,166,319 A | 12/2000 | Matsuyama |
| 6,169,246 B1 | 1/2001 | Wu et al. |
| 6,172,297 B1 | 1/2001 | Hezel et al. |
| 6,258,620 B1 | 7/2001 | Morel et al. |
| 6,288,325 B1 | 9/2001 | Jansen et al. |
| 6,294,274 B1 | 9/2001 | Kawazoe et al. |
| 6,307,148 B1 | 10/2001 | Takeuchi et al. |
| 6,310,281 B1 | 10/2001 | Wendt et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,335,479 B1 | 1/2002 | Yamada et al. |
| 6,361,718 B1 | 3/2002 | Shinmo et al. |
| 6,372,538 B1 | 4/2002 | Wendt et al. |
| 6,380,480 B1 | 4/2002 | Norimatsu et al. |
| 6,423,565 B1 | 7/2002 | Barth et al. |
| 6,537,845 B1 | 3/2003 | McCandless et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,303,788 B2 | 12/2007 | Kataoka et al. |
| 7,319,190 B2 | 1/2008 | Tuttle |
| 7,364,808 B2 | 4/2008 | Sato et al. |
| 7,441,413 B2 | 10/2008 | Bae et al. |
| 7,442,413 B2 | 10/2008 | Zwaap et al. |
| 7,544,884 B2 | 6/2009 | Hollars |
| 7,576,017 B2 | 8/2009 | Tuttle |
| 7,736,755 B2 | 6/2010 | Igarashi et al. |
| 7,741,560 B2 | 6/2010 | Yonezawa |
| 7,846,750 B2 | 12/2010 | Boyer |
| 7,855,089 B2 | 12/2010 | Farris, III et al. |
| 7,863,074 B2 | 1/2011 | Wieting |
| 7,863,518 B2 | 1/2011 | Terakawa et al. |
| 7,875,945 B2 | 1/2011 | Krasnov et al. |
| 7,910,399 B1 | 3/2011 | Wieting |
| 7,955,891 B2 | 6/2011 | Wieting |

(56) References Cited

U.S. PATENT DOCUMENTS

| | | |
|---|---|---|
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,026,122 B1 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 8,263,494 B2 | 9/2012 | Patterson |
| 8,287,942 B1 | 10/2012 | Huang et al. |
| 2002/0002992 A1 | 1/2002 | Kariya et al. |
| 2002/0004302 A1 | 1/2002 | Fukumoto |
| 2002/0061361 A1 | 5/2002 | Nakahara |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0161539 A1 | 8/2004 | Miyakawa |
| 2004/0187917 A1 | 9/2004 | Pichler |
| 2004/0191949 A1 | 9/2004 | Iwata et al. |
| 2004/0191950 A1 | 9/2004 | Nakamura et al. |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0223570 A1 | 10/2005 | Yonezawa et al. |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0004078 A1 | 1/2007 | Alberts |
| 2007/0006914 A1 | 1/2007 | Lee |
| 2007/0089782 A1 | 4/2007 | Scheuten et al. |
| 2007/0116892 A1 | 5/2007 | Zwaap et al. |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duern et al. |
| 2007/0193623 A1 | 8/2007 | Krasnov |
| 2007/0209700 A1 | 9/2007 | Yonezawa et al. |
| 2007/0243657 A1 | 10/2007 | Basol et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Milshtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0115827 A1 | 5/2008 | Woods et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0216886 A1 | 9/2008 | Iwakura |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0084438 A1 | 4/2009 | den Boer et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0087027 A1 | 4/2010 | Wieting |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0224247 A1 | 9/2010 | Bartholomeusz et al. |
| 2010/0233386 A1 | 9/2010 | Krause et al. |
| 2010/0258179 A1 | 10/2010 | Wieting |
| 2010/0267189 A1 | 10/2010 | Yu et al. |
| 2010/0267190 A1 | 10/2010 | Hakuma et al. |
| 2010/0297798 A1 | 11/2010 | Adriani et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0270341 A1 | 10/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |

(56) References Cited

FOREIGN PATENT DOCUMENTS

| | | |
|---|---|---|
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Guillen C., "CuInS$_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of Zn$_x$Cd$_{1-x}$S Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of CuIn$_{1-x}$Ga$_x$Se$_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in $n$-TiO$_2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Gordillo et al. "Electrical and morphological properties of low resistivity Mo thin films prepared by magnetron sputtering," 9Brazilian Journal of Physics 36:982-985 (Sep. 2006).

Grecu et al. "Spectroscopic Characterization of Chemical Bath Deposited Cadmium Sulphide Layers", Journal of Optoelectronics and Advanced Matenals 6:127-132 (Mar. 2004).

Onuma et al., Preparation and Characterization of CuInS Thin Films Solar Cells with Large Grain, Elsevier Science B.V; Solar Energy Materials & Solar Cells 69 (2001) pp. 261-269.

Palm et al. "Second generation CIS solar modules," Solar Energy 77:757-765 (Dec. 2004).

Scofield "Sodium diffusion, selenization, and microstructural effects associated with various molybdenum back contact layers for CIS-based solar cells", Proceedings of the 24th IEEE Photovoltaic Specialists Conference, pp. 164-167 (1995).

* cited by examiner

METHOD AND STRUCTURE FOR TILING INDUSTRIAL THIN-FILM SOLAR DEVICES

CROSS-REFERENCE TO RELATED APPLICATION

This application claims priority to U.S. Provisional Patent Application No. 61/297,661, filed Jan. 22, 2010, entitled "Method and Structure for Tiling Industrial Thin-Film Solar Devices" by inventor Robert D. Wieting, commonly assigned and incorporated by reference herein for all purposes

BACKGROUND OF THE INVENTION

The present invention relates generally to photovoltaic techniques. More particularly, the present invention provides a method and structure for tiling solar devices to a transparent cover plate. Merely by example, embodiments of the present invention are applied to laminate two or more industrial-sized solar panels based on thin-film photovoltaic materials including copper indium diselenide species (CIS), copper indium gallium diselenide species (CIGS), and/or others.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

BRIEF SUMMARY OF THE INVENTION

The present invention relates generally to photovoltaic techniques. More particularly, the present invention provides a method and structure for tiling two or more solar devices to a transparent cover plate. Merely by example, the present invention is applied to laminate two or more thin-film solar devices having sizes of about 165 cm or greater.

According to an embodiment, the present invention provides a method for integrating photovoltaic module. The method includes providing a cover plate having a first surface and a second surface opposed to the first surface. The method further includes supplying two or more solar devices respectively formed on substrates. Each of the two or more photovoltaic devices includes a plurality of photovoltaic cells electrically coupled to each other. Each cell is characterized by a thin-film photovoltaic layer sandwiched between a first electrode material and a second electrode material. The first electrode material overlies the substrate and the second electrode material overlies the thin-film photovoltaic layer. Additionally, the method includes disposing the two or more solar devices side by side to laminate with the cover plate by means of a first organic material filled between the second electrode material and the second surface. Each of the two or more solar devices has a peripheral edge region being sealed by a second organic material. Furthermore, the method includes electrically coupling the two or more solar devices to each other.

In an alternative embodiment, the present invention provides a structure for tiling thin-film solar devices. The structure includes a cover plate with at least a dimension of about 165 cm and greater in one direction including a front surface and a rear surface opposed to the front surface. Additionally, the structure includes two or more solar devices laminated side by side to the rear surface and electrically coupled to each other by a ribbon connector. Each of the two or more solar devices includes a plurality of thin-film photovoltaic cells overlying a substrate. Each of the thin-film photovoltaic cells has a stripe shaped pattern in parallel to each other.

It is to be appreciated that the present invention provides numerous benefits over conventional techniques. Among other things, the method and structure provided in the present invention are compatible but scaled to very large industrial panels from conventional modules, which allow cost effective implementation of new generation integrated thin-film photovoltaic modules into large scale commercial applications. The integrated solar module laminates two or more thin-film photovoltaic devices to a common cover plate. This effective enhances the power capacity of the solar module by extending either circuit current delivered from the entire module or the voltage level for coupling with outside electric contacts. Physically, each of the two or more thin-film solar devices can have a dimension of 65 cm times 165 cm and be disposed side by side onto a hardened glass plate having a dimension of 165 cm or greater in one direction. The encapsulation of the integrated module is compatible with stand alone module, so that additional cost saving in packaging process and material can be achieved by implementation of current invention. Additionally, scale up the stand alone thin-film solar device and their integration provide high quality with reduced cost but enhanced overall efficiency over 11%. There are other benefits as well.

DETAILED DESCRIPTION OF THE INVENTION

Figure 1:
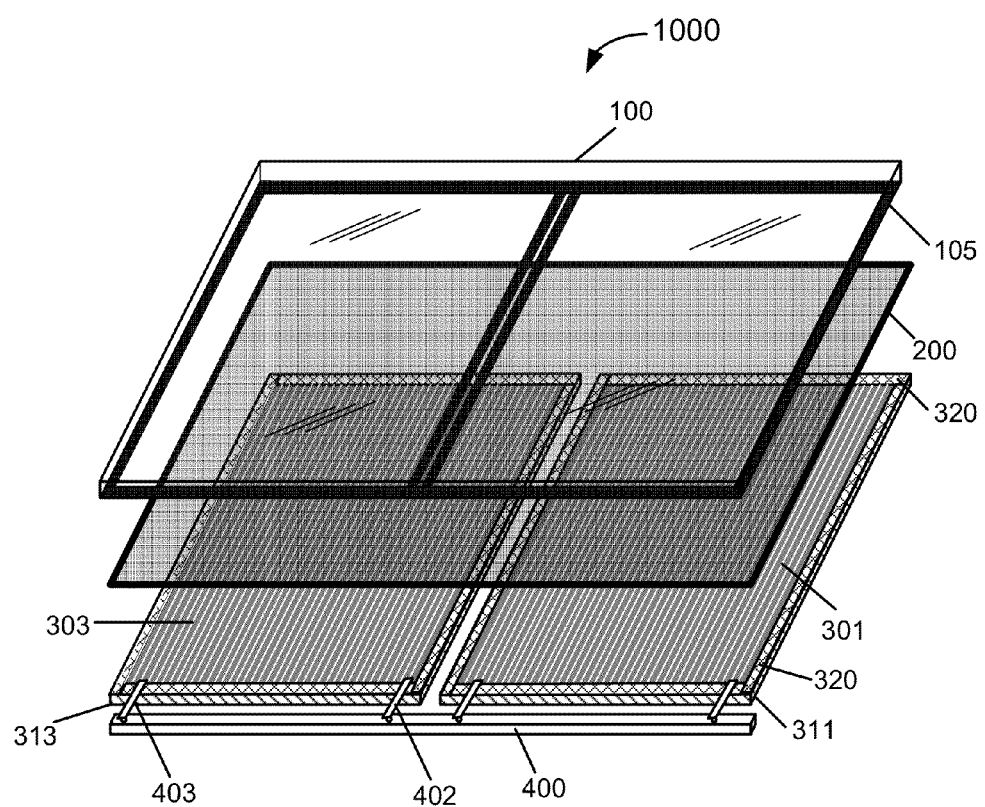
FIG. 1 is a perspective view of a method and structure for tiling solar devices according to an embodiment of the present invention.

FIG. 1 is a perspective view of a method and structure for tiling solar devices according to an embodiment of the present invention. This diagram is merely an example, which should not limit the scope of the claims herein. As shown, a structure 1000 for tiling solar devices on to a cover plate is schematically broken down to a group of basic elements. In an embodiment, the structure 1000 includes a cover plate 100, two or more solar devices 301 and 303 respectively formed on a substrate 311 and 313, a sealant material 320, a fill material 200, a common conductor 400, and a plurality of ribbon conductor 402. The cover plate is typically flat with a front surface on light-receiving side and a rear surface for attaching one or more solar devices. The cover plate 100 has a thickness in the range of 0.5-10 mm, preferably 1-5 mm, and can be of any material that has sufficient transparency above the photovoltaic layer. Suitably the cover plate is a cover glass, preferably hardened glass. In a specific embodiment, the cover plate 100 can be a polymeric material bearing an optical transparency characteristic. In another specific embodiment, the cover plate 100 has a large physical dimension capable of allowing two or more industrial sized solar devices together to be laminated thereon. For example, the dimension of the cover plate 100 may be at least 165 cm or greater in one direction. Of course the cover plate 100 can have various other shapes, including a rectangular shape.

Referring to FIG. 1, the two or more solar devices 301 and 303 are attached to the rear surface of the cover plate 100. Normally, the two or more solar devices are not covering all area of the cover plate 100. In an embodiment, the two or more solar devices 301 and 303 are disposed side by side having some additional gaps in between. Each of the solar devices 301 and 303 is substantially a kind of thin-film solar devices having a rectangular shape with its length substantially fitted to the cover plate 100 in one direction and total width of all solar devices plus the addition gaps substantially fitted with the cover plate 100 in another direction. In a specific embodiment, the thin-film solar device 301 or 303 is made from a chalcopyrite semiconductor thin film photovoltaic active layer sandwiched by two electrode layers, an upper electrode and a lower electrode. In an implementation, the chalcopyrite semiconductor thin film photovoltaic active layer includes copper indium diselenide absorber overlapped by an optical transparent cadmium sulfide window layer. The upper-electrode overlying the window layer is also optical transparent allowing photons to be absorbed by the photovoltaic layer below and converted into electrons.

As shown in FIG. 1, each cell has a strip shape in parallel to all other cells. For example, the strip shape of each cell is about 6 millimeters in width and has a length up to the substrate except some border region at two ends. Within the border region of the thin-film solar device 301 or 303, a polymeric sealant material 320, such as a polymer tape, is applied to protect the solar device from ingress of moisture. Corresponding to the border region of each solar device 301 on the cover plate 100 an opaque frame region 105 is formed on the rear surface for block light and in particular UV irradiation to the polymer material of the photovoltaic cells. The rest portion, or the major area, of the cover plate 100 is substantially transparent for full spectrum of the sun light overlying the plurality of thin-film photovoltaic cells in stripe shape. Finally, each of the two or more solar devices is laminated its upper-electrode surface to the rear surface of the cover plate by means of the fill material 200. In a specific embodiment, the fill material is an organic polymer material bearing both characteristics of mechanical bonding and optical transparency. For example, the fill material 200 is a transparent polymer selected from ethylene vinyl acetate (EVA) and polyvinyl butyral (PVB), which fills the intermediate space and provides a seal at the circumference of each module for coupling with the sealant material 311 and 313. Of course, there can be many alternatives, variations, and modifications.

Additionally, the two or more solar devices 301 and 303 are inter-coupled electrically while being laminated together to the cover plate 100 to form an integrated thin-film photovoltaic module. The electric coupling between any two neighboring solar devices attached to the cover plate can be electrical in parallel or in series, allowing the integrated thin-film photovoltaic module to support higher electric current capacity or voltage power level. In an embodiment, these electric coupling is achieved by means of a common conductor 400 disposed along an edge of the integrated thin-film photovoltaic module and a plurality of ribbon conductor 402 to connect from the two or more solar devices 301 and 303 to the common conductor 400. In particular, one ribbon conductor 402 may couple to the upper-electrode of a solar device while another ribbon conductor 403 may couple to the lower-electrode of the same solar device. In another embodiment, one ribbon conductor may connect from the upper-electrode of a first solar device 301 to pass a hole through it including the substrate to couple with the lower-electrode of a second solar device 303 next to device 301. Respectively, another ribbon conductor coupled to the upper-electrode of the first solar device 301 or the lower-electrode of the second device 303 may be linkable to an external electric contact for collecting the current from the entire integrated thin-film module.

Figure 2:
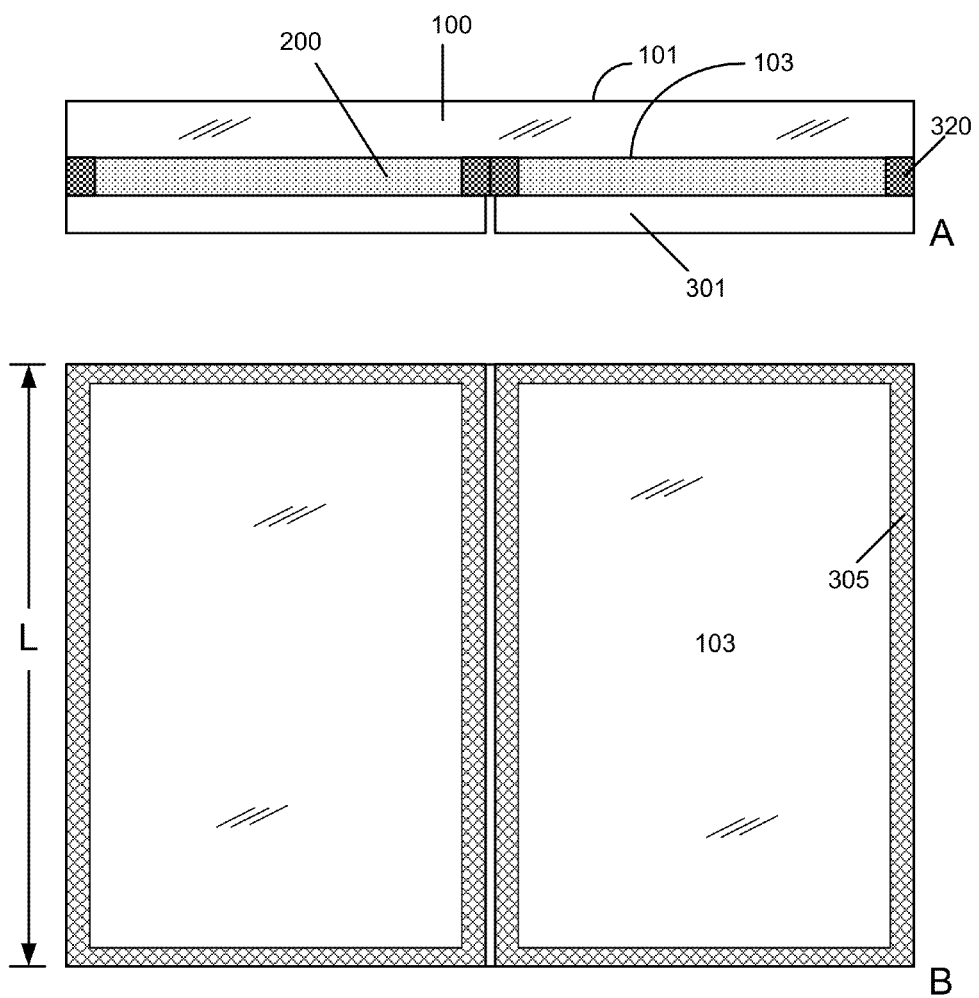
FIG. 2 illustrates a side view (A) and a bottom view (B) of a cover plate laminated to two solar devices according to an embodiment of the present invention.

FIG. 2-A is side view of a cover plate laminated to two solar devices according to an embodiment of the present invention. This diagram is merely an example, which should not limit the scope of the claims herein. As shown, the cover plate 100 includes a transparent and flat plate having a front surface 101 and a rear surface 103. The front surface 101 may be applied as a light-receiving side and the rear surface 103 is utilized for attaching two (or more) solar devices 301. In an embodiment, the two solar devices 301 are encapsulated to the rear surface 103 by means of a transparent organic material 200. The transparent organic material 200 fills the intermediate space region between the rear surface 103 of the cover plate 100 and a top surface of the solar device 301. In a specific embodiment, a circumferential border region of the solar device 301, including the applied encapsulating transparent organic material 200, has been protected by a polymeric material 320, which is a sealant mainly for protecting the solar device against ingress of moisture through the border region. As shown, the cover plate 100 has its width in a desired dimension large enough to fit total widths of two solar devices 301 plus some extra device-device spacing when the two solar devices are disposed side by side. In an implementation, the width of a single solar device 301 may be as large as 65 cm for some industrial sized thin-film photovoltaic module. Therefore, the cover plate 100 for the integrated solar module may be twice that size or even larger.

Referring to FIG. 2-B, a bottom view of the cover plate according to the embodiment of the present invention is shown. This is the bottom view of the cover plate 100 shown in FIG. 2-A. In accordance with the invention the cover plate 100 has its partial area made as opaque. This is achieved by a coating material 305 on the cover plate within the as-mentioned area. The coating can be painted, screen printed and heated, but can also e.g. be a polymeric tape. For example, a ceramic paste can be screen-printed and tempered. Instead of coating, also the body of the cover plate 100 can be modified in the area so as to be opaque, for example by adding a pigment or by inclusion of an opaque layer or substance. The coating is preferably non-conducting. In an embodiment, the as-mentioned opaque area is located properly on the rear surface 103 and in a framed region located just above a border area of a solar device 301 when the cover plate 101 is laminated with the solar device 301. Because the border area of the solar device does not have photovoltaic active material, the opaque area on the cover plate includes substantially all area that can receive light and under which area no photovoltaic layer is present. However, if no such opaque area is used, the photovoltaic layer edges of the solar device will be easily subjected to heating by sun light irradiation different from area having photovoltaic layer, which leads to thermal stress and eventually macroscopic cracking to the solar device. Additionally, the UV degradation of the polymeric material along the solar device edge will be a problem. Therefore, adding the opaque coating 305 characterized by color suitably dark, preferably black, and capable of substantially blocking UV radiation becomes a solution for preventing from the UV degradation and undesired thermal stress. The details of adding proper opaque area to the cover plate when packaging thin-film photovoltaic module can be found in a U.S. patent application Ser. No. 12/158,239 titled "PHOTOVOLTAIC DEVICE AND METHOD FOR ENCAPSULATING" filed by Hermann Calwer etc. on Dec. 20, 2006, incorporated by reference. In an specific embodiment, for a cover plate 100 designed to fit two solar devices side by side, the opaque coating 305 is applied with two such framed regions side by side, as shown in FIG. 2-B. Additionally, the non-opaque region shown is projected just above the thin-film photovoltaic cells of the laminated solar devices 301. The length dimension L of the cover plate 100 is properly selected to fit the length of each of the two or more solar devices 301, which are disposed side by side when encapsulated with the cover plate 100. In an implementation for integrating large scale industrial thin-film solar panel, the length L can be as large as 165 cm and greater.

Figure 3:
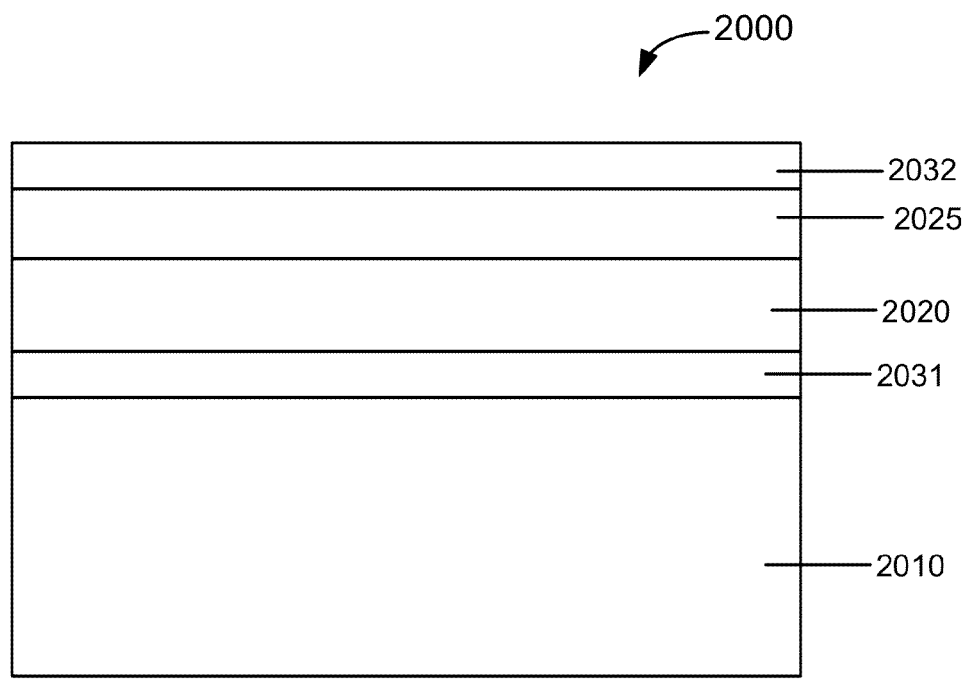
FIG. 3 is a schematic cross-section view of a thin-film solar device according to an embodiment of the present invention.

FIG. 3 is a schematic cross-section view of a thin-film solar device according to an embodiment of the present invention. This diagram is merely an example, which should not limit the scope of the claims herein. In an embodiment, the thin-film solar device 2000 is supported on a substrate 2010 which is typically glass of about 1 to 3 millimeters thickness. A back contact or lower electrode comprises a metal layer 2031 deposited upon substrate 2010. Layer 2031, in the preferred embodiment, typically comprises molybdenum which has been deposited by sputtering to a thickness of about 0.2 to 2 microns. On top of the lower electrode 2031 a p-type chalkopyrite semiconductor layer 2020 is arranged, having a thickness of about 0.2 to 2 microns.

In a specific embodiment, a particular class of thin-film solar devices has an absorber layer formed of a group I-III-VI semiconductor, also referred to as a chalkopyrite semiconductor. Such a semiconductor is generally of the copper indium diselenide ("CIS") type, wherein this expression is to be understood such that indium can be partly or fully replaced by gallium and/or aluminum, and selenium can be partly or fully replaced by sulphur. The CIS type layer can further comprise a low concentration, trace, or a doping concentration of one or more further elements or compounds, in particular alkali such as sodium, potassium, rubidium, cesium, and/or francium, or alkali compounds. The concentration of such further constituents is typically 5 wt % or less, preferably 3 wt % or less. The CIS layer 2020 can be formed by sputter deposition of a sequence of layers comprising the metal constituents of the CIS layer, followed by a programmed thermal annealing processing with an environment containing Selenium vapor species and/or additionally sulfide species. A preferred process has been described in U.S. Patent Application No. 61/178,459 titled "Method and System for Selenization in Fabricating CIGS/CIS Solar Cells" filed on May 14, 2009, commonly assigned to Stion Corporation, incorporated for all purpose by reference.

On top of the CIS type layer commonly a buffer layer or window 2025 is arranged. The buffer layer can include CdS. A Cd-free inorganic layer such as Zn(O,S) possibly also including hydroxide may be used, but the buffer layer can also be omitted. It is also possible to arrange a layer of intrinsic ZnO, i.e. a ZnO layer that having a bulk resistivity higher than 1 Ohm.cm, preferably higher than 100 Ohm.cm, such as between 1 and $10\times10^3$ Ohm.cm. Preferably the layer is between 10 nm and 150 nm thick. The solar device 2000 further comprises an upper-electrode 2032 overlying the buffer layer 2025. In an example, the upper electrode layer is n-type ZnO layer appropriately doped to provide relatively low resistivity, for example, better than about $2.0\times10^{-3}$ Ohm.cm, and preferably better than $1.0\times10^{-3}$ Ohm.cm. The thickness of the layer 2032 ranges from 0.5 to 2 microns. In an embodiment, the thin-film solar device 2000 described above is a same class of the two or more solar devices 301 that are laminated to the cover plate for forming an integrated photovoltaic module.

Figure 4:
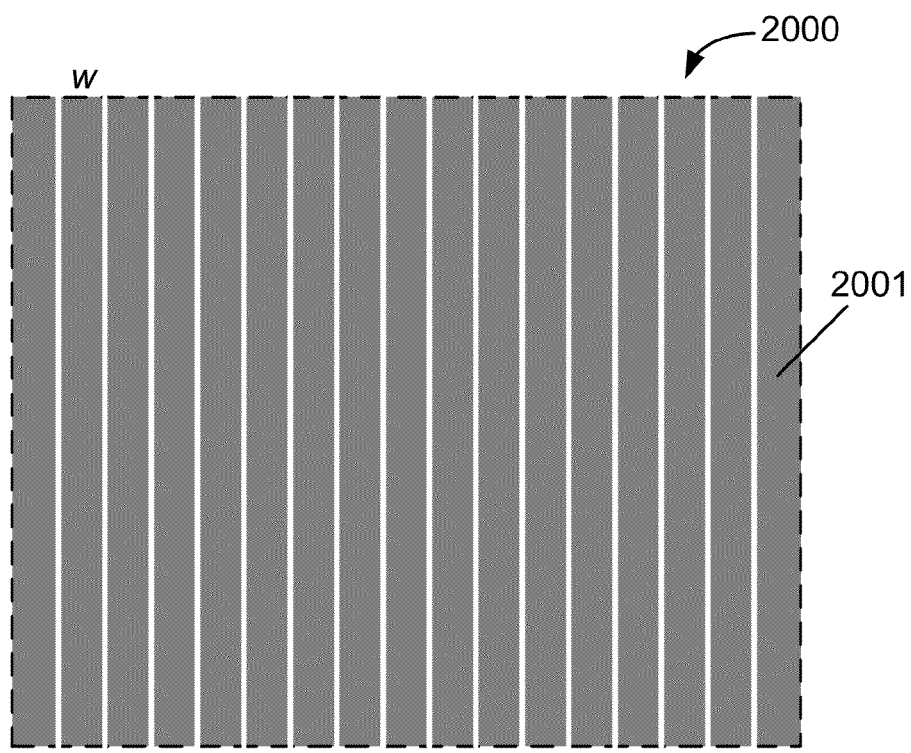
FIG. 4 is a schematic top view of a thin-film solar device with stripe shaped cell patterns according to the embodiment of the present invention.

FIG. 4 is a schematic top view of a thin-film solar device with stripe shaped cells according to the embodiment of the present invention. This diagram is merely an example, which should not limit the scope of the claims herein. In a specific embodiment, manufacturing the CIS based thin-film solar device includes a cell patterning process for creating a plurality of stripe shaped cells divided by line patterns in one or more layers. For example, a first plurality of patterns in the lower electrode layer 2031 and a second plurality of patterns in the CIS absorber layer 2020 and partially in the lower-electrode layer 2031 are formed using either laser or mechanical scribe device. The first plurality of patterns and the second plurality of patterns (and any additional series of patterns on buffer layer or upper electrode layer) are utilized for forming electric links from cell to cell and to the electric contact for the thin-film solar device. As shown in FIG. 4, a portion of the thin-film solar device 2000 includes a plurality of photovoltaic cells 2001 each having a width w (spacing between two neighboring line patterns) extending from one end of the substrate to another end (there may be no photovoltaic layers on 1-2 cm border regions of the substrate). In a specific embodiment, the width w of each of these cells 2001 is about 6 mm. The length of these cells 2001 can ranges from 20 cm to 165 cm or greater depending on the physical dimension of the substrate overlying which the solar device is formed. Of course, there can be many variations, alternatives, and modifications.

Figure 5:
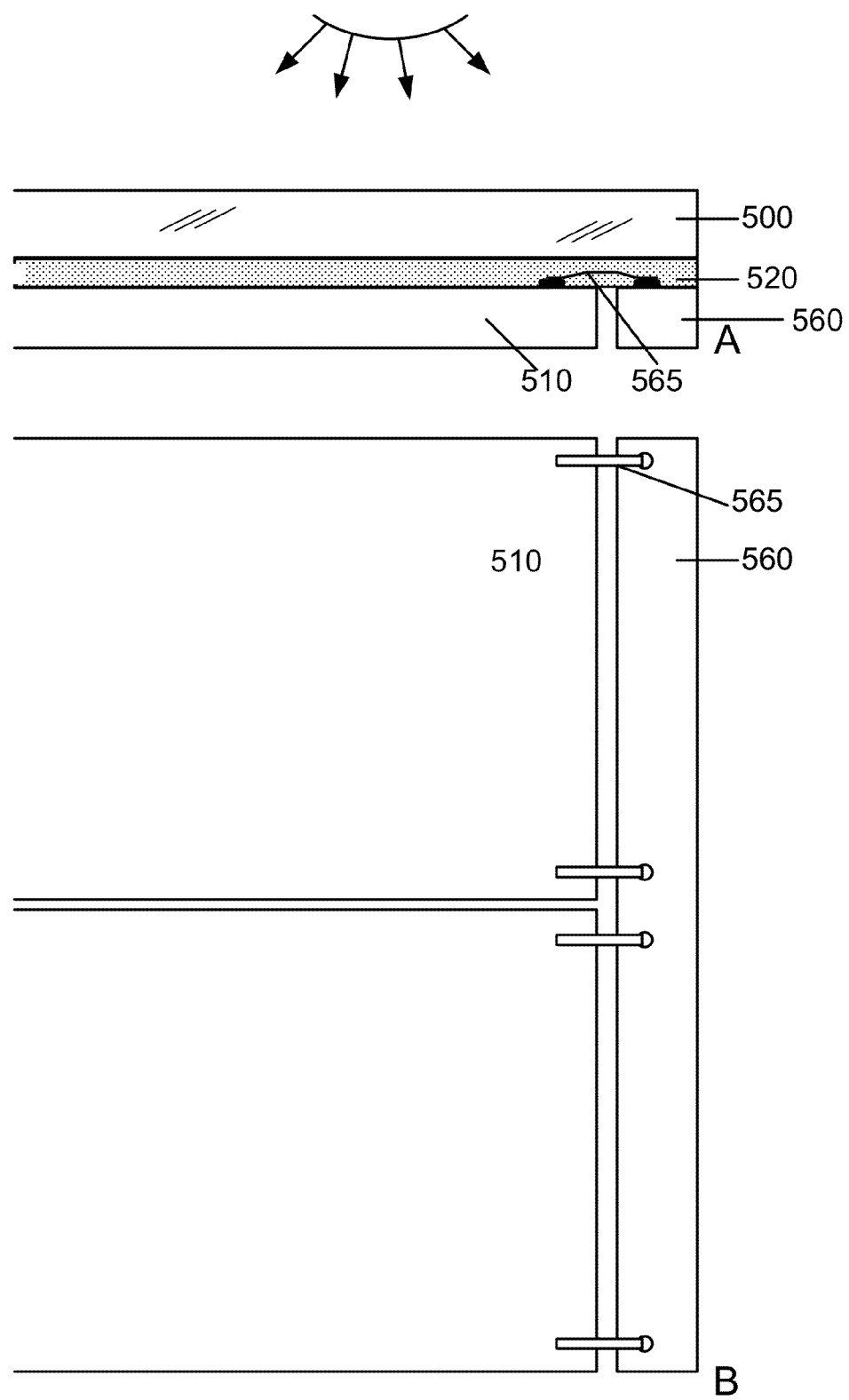
FIG. 5 illustrates a cross-section view (A) and a top view (B) of laminated solar devices including ribbon electric conductors according to an embodiment of the present invention.

FIG. 5-A and 5-B illustrate a cross-section view and a top view of laminated solar devices electrically coupled by one or more ribbon conductors between the cover plate and the solar devices according to an embodiment of the present invention. As shown in FIG. 5-A, an integrated photovoltaic module includes at least a solar device 510 laminated to a cover plate 500 by means of a transparent polymeric material 520. In an embodiment, near one side of peripheral border region of the integrated module a common conductor 560 is disposed and a pair of ribbon conductors 565 is used for making electric coupling between the solar device 510 and the common conductor 560. The ribbon conductor 565 is buried within the polymeric material 520. In FIG. 5B, a top view of two solar devices disposed side by side for laminating to the cover plate is shown. From this angle, each ribbon conductor 565 is seen to directly connect each solar device 510 to the common conductor 560. A specific ribbon conductor 565 couples to an upper-electrode or lower-electrode of the solar device 510. The common conductor is arranged to collect the current from the entire integrated module and is connected or connectable to an electrical contact outside the module.

Figure 6:
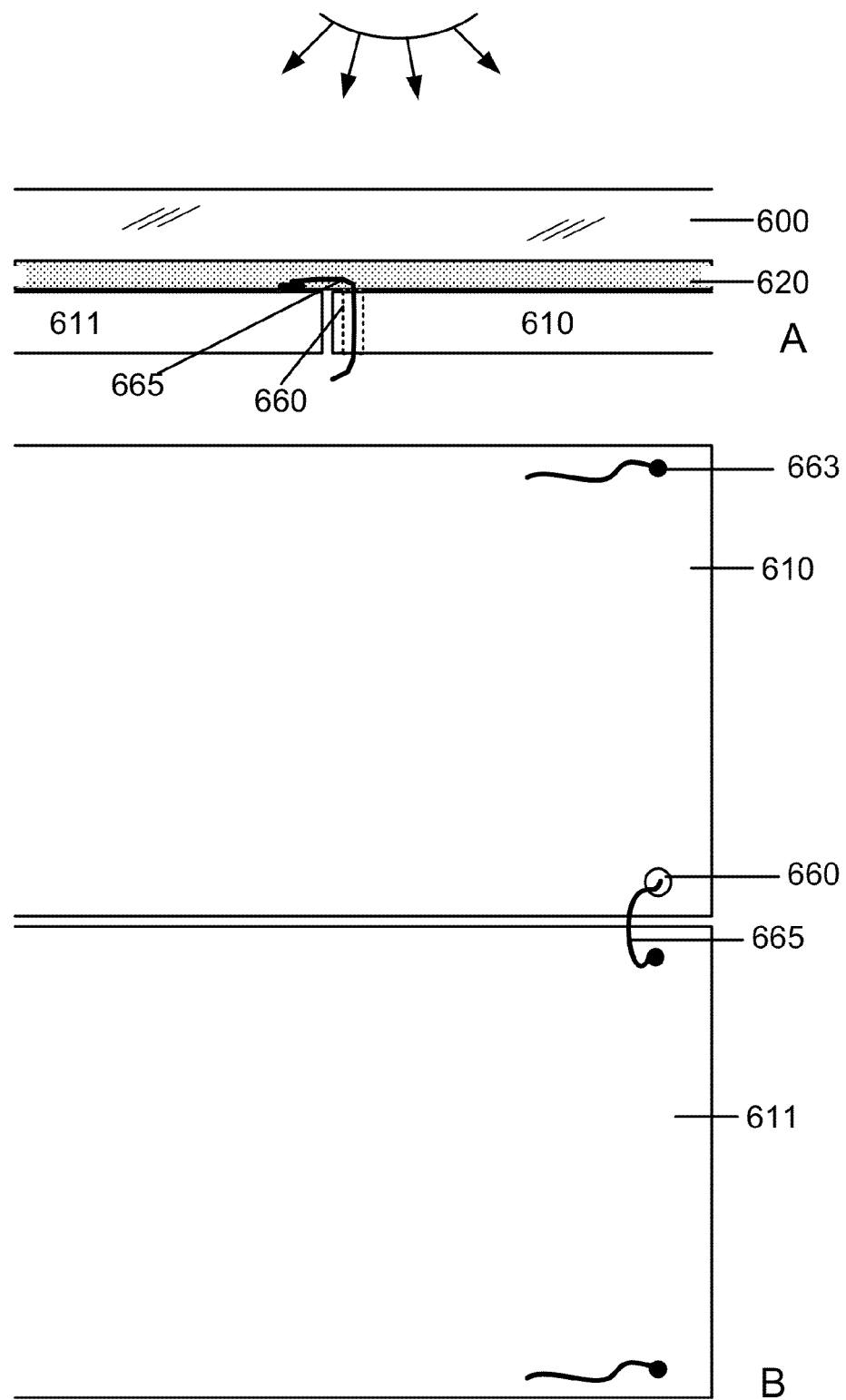
FIG. 6 illustrates a cross-section view (A) and a top view (B) of laminated solar devices including ribbon electric conductors according to another embodiment of the present invention.

FIG. 6-A and 6-B are a cross-section view and a top view of laminated solar devices including ribbon electric conductors according to another embodiment of the present invention. This diagram is merely an example, which should not limit the scope of the claims herein. As shown, in another embodiment of the invention an integrated photovoltaic module includes a thin-film solar device 610 and at least another thin-film solar device 611 disposed next to the solar device 610 both laminated to a rear surface of a cover plate 600 by means of a transparent polymeric material 620. The solar device 610 or 611 includes a thin-film based photovoltaic absorber layer overlying a metal electrode layer formed on a substrate. For each of the two thin-film solar devices, an upper electrode layer (not shown explicitly), which is a transparent oxide material coupled directly to the transparent polymeric material 620 in this encapsulated structure. In a specific embodiment, the solar device 610 including its supporting substrate includes one or more through-holes 660 prepared before the lamination. A ribbon conductor 665, which coupled to the upper electrode layer of the solar device 611, can pass through the through-hole 660 to the back side of the substrate of the solar device 610 to be connectable with an electric contact mounted there or outside the entire integrated module. The ribbon conductor 665 completes the inter-device electric coupling between the two thin-film solar device 610 and 611 so that the integrated module can provide doubled power capacity. Additionally, each thin-film solar device includes other ribbon conductors 663 respectively attached to either upper or lower electrode layer of either the solar device 610 or solar device 611 to complete the electric coupling either in series or in parallel.

It is to be appreciated that the present invention provides numerous benefits over conventional techniques. Among other things, the method and structure provided in the present invention are compatible, but scaled to very large industrial panels from conventional modules, which allow cost effective implementation of new generation integrated thin-film photovoltaic modules into large scale commercial applications. The integrated solar module laminates two or more thin-film photovoltaic devices to a common cover plate. This effective enhances the power capacity of the solar module by extending either circuit current delivered from the entire module or the voltage level for coupling with outside electric contacts. Physically, each of the two or more thin-film solar devices can have a dimension of 65 cm times 165 cm and be disposed side by side onto a hardened glass plate having a dimension of 165 cm or greater in one direction. The encapsulation of the integrated module is compatible with stand alone module, so that additional cost saving in packaging process and material can be achieved by implementation of current invention. Additionally, scale up the stand alone thin-film solar device and their integration provide high quality with reduced cost but enhanced overall efficiency over 11%.

It is understood that the examples and embodiments described herein are for illustrative purposes only and that various modifications or changes in light thereof will be suggest to persons skilled in the art and are to be included within the spirit and purview of this application and scope of the appended claims.

What is claimed is:

1. A method for integrating a photovoltaic module, the method comprising:

providing a cover plate having a first surface and a second surface opposed to the first surface;

supplying at least two solar devices respectively formed on substrates, each of the at least two photovoltaic devices including a plurality of photovoltaic cells electrically coupled to each other, each cell being characterized by a thin-film photovoltaic layer sandwiched between a first electrode material and a second electrode material, the first electrode material overlying the substrate and the second electrode material overlying the thin-film photovoltaic layer;

disposing the at least two solar devices side by side to laminate with the cover plate by means of a first organic material filled between the second electrode material and the second surface, each of the solar devices having a peripheral edge region being sealed by a second organic material; and electrically coupling the solar devices to each other.

2. The method of claim 1 wherein the first organic material is a transparent polymer selected from ethylene vinyl acetate and polyvinyl butyral.

3. The method of claim 1 wherein the second organic material comprises a polymeric sealant material selected from butyl rubber, urethane and polyurethane materials, polyisobutylene materials, epoxide materials, polysulfamide materials, and cyanoacrylates.

4. The method of claim 1 wherein each of the solar devices comprises a dimension of about 65 cm by 165 cm including the plurality of photovoltaic cells each having a stripe shaped pattern of about 5 mm by about 160 cm.

5. The method of claim 1 wherein the thin-film photovoltaic layer comprises a chalcopyrite compound semiconductor material selected from copper indium diselenide, copper indium disulfide, copper indium gallium diselenide, and copper indium disulfide.

6. The method of claim 1 wherein the electrically coupling comprises using a ribbon conductor embedded within the first organic material to connect to an electric contact disposed along an edge of the cover plate.

7. The method of claim 1 wherein the electrically coupling comprises using a ribbon conductor passed through the solar device and the substrate to an electrical contact disposed at rear side of the substrate.

8. The method of claim 1 wherein the cover plate comprises a hardened glass having a transparent region over main areas of the solar devices and an opaque region over the peripheral edge regions of the solar devices.

9. The method of claim 1 wherein the cover plate comprises a transparent polymer.

* * * * *